United States Patent [19]

Suzuki

[11] 4,276,612

[45] Jun. 30, 1981

[54] MAGNETIC BUBBLE MEMORY DEVICE WITH DIVIDED ELECTRICAL CONDUCTORS

[75] Inventor: Ryo Suzuki, Kokubunji, Japan

[73] Assignee: Hitachi, Ltd., Tokyo, Japan

[21] Appl. No.: 51,145

[22] Filed: Jun. 22, 1979

[30] Foreign Application Priority Data

Jul. 5, 1978 [JP] Japan .................................. 53-80903

[51] Int. Cl.$^3$ ............................................. G11C 19/08
[52] U.S. Cl. ......................................... 365/12; 365/15
[58] Field of Search ............................. 365/12, 15, 16

[56] References Cited

U.S. PATENT DOCUMENTS

| | | | |
|---|---|---|---|
| 4,021,791 | 3/1977 | Bobeck et al. | 365/15 |
| 4,075,611 | 2/1978 | Gergis | 365/15 |

OTHER PUBLICATIONS

Electronics—Aug. 2, 1979, pp. 99–108.
Journal of Applied Physics on Magnetism & Magnetic Materials—vol. 50, No. 3, Mar. 1979, pp. 2222–2224.
Computer Design—Apr. 1979, pp. 168–174.

*Primary Examiner*—James W. Moffitt
*Attorney, Agent, or Firm*—Craig & Antonelli

[57] ABSTRACT

A magnetic bubble memory device according to this invention is characterized in that an electrical conductor which supplies a current pulse for driving gates having a replicating function is divided into a plurality of parts. The divided parts are connected to current pulse generator means in a mutually parallel relationship. As the current pulse generator means, accordingly, a pulse driver circuit whose output is a low voltage can be used. As a result, the cost of the pulse driver circuit is low.

7 Claims, 3 Drawing Figures

MAGNETIC BUBBLE MEMORY DEVICE WITH DIVIDED ELECTRICAL CONDUCTORS

FIELD OF THE INVENTION

This invention relates to magnetic bubble memories, and more particularly to an improved construction of electrical conductors for such memories.

DESCRIPTION OF THE PRIOR ART

Magnetic bubble memories are now well known in the art. One mode of operation of such memories is termed the "field access" mode because bubble movement in a film of bubble material is responsive to a magnetic drive field rotating in the plane of the film. Typically, the film comprises an epitaxial film of garnet although the use of amorphous films is contemplated. The bubble pattern representative of information moves in the film along paths defined by a periodic pattern of magnetically soft (high permeability) elements, typically permalloy.

The field access bubble memory has ordinarily been arrayed by the "major-minor loops" organization disclosed in U.S. Pat. No. 3,618,054.

Recently, in order to improve the read cycle time in the "major-minor loops" organization, the "major lines-minor loops" organization has been proposed (in, for example, U.S. Pat. Nos. 4,007,453 and 4,070,659).

Typical examples of construction of this organization are shown in FIGS. 1 and 2. Referring to FIG. 1, magnetic bubbles generated by a magnetic bubble generator 1 are propagated on a write major line 2 in response to a rotating magnetic field. When the magnetic bubbles on the write major line 2 have aligned at the respective positions of write gates 5—5 corresponding to a plurality of minor loops 4—4, a transfer current pulse from a transfer pulse source 6 is caused to flow through an electrical conductor 7. Thus, the write gates 5—5 are simultaneously enabled, and the magnetic bubbles on the write major line 2 enter the minor loops 4—4 in block.

Thereafter, the magnetic bubbles on the respective minor loops 4—4 are circulated thereon in response to the rotating magnetic field. When the write gates 5—5 are kept disabled, the magnetic bubbles generated by the generator 1 propagate on the write major line 2 and reach an annihilator such as guardrail 8, in which they are annihilated.

The magnetic bubbles circulating on the respective minor loops 4—4 are replicated at positions corresponding to read gates 11—11 on the minor loops 4—4 in such a way that a replicate current pulse from a replicate/transfer pulse source 9 is caused to flow through an electrical conductor 10. The replicated magnetic bubbles exit onto a read major line 12 in block. Thereafter, the magnetic bubbles propagate on the read major line 12 in response to the rotating magnetic field and reach a detector such as expansion detector 13, in which they are detected. When a stored content on the minor loops 4—4 is to be rewritten, a transfer current pulse from the replicate/transfer pulse source 9 is caused to flow through the electrical conductor 10, whereby the read gates 11—11 are enabled, and the magnetic bubbles on the minor loops 4—4 are caused to exit to the read major line 12 and annihilated via the detector 13. The output of the detector 13 at this time is naturally neglected. In this manner, the operations of write, read and annihilate are executed.

FIG. 2 shows an example of construction which makes successive reading possible by the use of the construction explained with reference to FIG. 1 (see, for example, U.S. Pat. No. 4,075,611). As apparent from the figure, two sets of quite the same construction as in FIG. 1 are existent in the state in which they are enclosed with a guardrail 14 serving also as an annihilator. However, minor loops 4'—4' and minor loops 4"—4" are of a number with the minor loops 4—4 in FIG. 1 equally divided, respectively. Operations in each set are quite the same as explained with reference to FIG. 1. Regarding the operations of the whole construction, the two sets are organically coupled so as to realize successive reading. More specifically, a distance difference corresponding to one cycle of the rotating magnetic field is set between the distance from the generator 1 to the write gates 5 of the minor loops 4'—4' and the distance from the generator 1' to the write gates 5' of the minor loops 4"—4". Further, the distance difference corresponding to one cycle of the rotating magnetic field is set between the distance from the read gates 11 of the minor loops 4'—4' to the detector 13 and the distance from the read gates 11' of the minor loops 4"—4" to the detector 13'. As a result, odd Nos. and even Nos. of a train of write information bits are distributively written into the minor loops 4'—4' and 4"—4" in the left and right sets. When the read operation is similarly considered, the information in the left and right sets are alternately detected in succession. Thus, a high-speed operation is realized.

With the above construction, however, when it is intended to increase the memory capacity per unit area, the dimensions of the various parts become very small. In consequence, the electric resistances of the gate driving electrical conductors 7 and 10 through which comparatively great current pulses must be caused to flow increase drastically. Especially, a current pulse having a comparatively great amplitude and width needs to be caused to flow for the replication of bubbles through the read gate-driving electrical conductor 10, and the increase of the electric resistance of this electrical conductor is a serious problem. By way of example, in a magnetic bubble memory device of 256 Kb/chip whose bit size is approximately 8 $\mu$m square, the electric resistances of the electrical conductors 7 and 10 are about 600–800$\Omega$. Unless a replicate current pulse of about 100 mA is caused to flow through the electrical conductor 10 having such high resistance, the normal gate operation cannot be effected. Accordingly, a pulse drive circuit serving as the replicate/transfer pulse source 9 needs to generate a voltage of 60–80 V. Although it is not impossible to fabricate the pulse drive circuit for generating such great pulse voltage, it is extremely difficult from the aspect of cost.

BRIEF DESCRIPTION OF THE INVENTION

It is accordingly an object of this invention to provide a magnetic bubble memory device which is free from the problem described above and which has a novel construction of electrical conductors.

In order to accomplish the object, according to this invention, a current pulse-supplying electrical conductor on a replicate/transfer gate side is divided into a plurality of parts, and they are connected to a pulse drive circuit in parallel with one another.

Owing to such construction, there are achieved the very advantageous effects (i) that the expensive high-voltage pulse drive circuit becomes unnecessary, so the driver circuit can be fabricated inexpensively, (ii) that since the low-voltage drive is possible, the occurrence of inter-layer punch-through faults lessens, (iii) that owing to the low-voltage pulse, noise which exerts influences on other functional parts is lower, etc.

DETAILED DESCRIPTION

Figure 2:
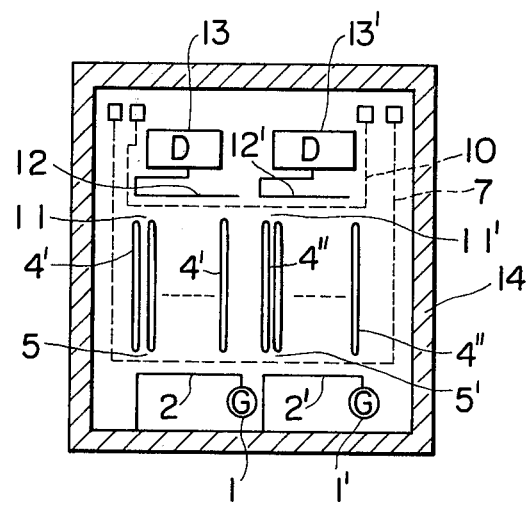
Figure 3:
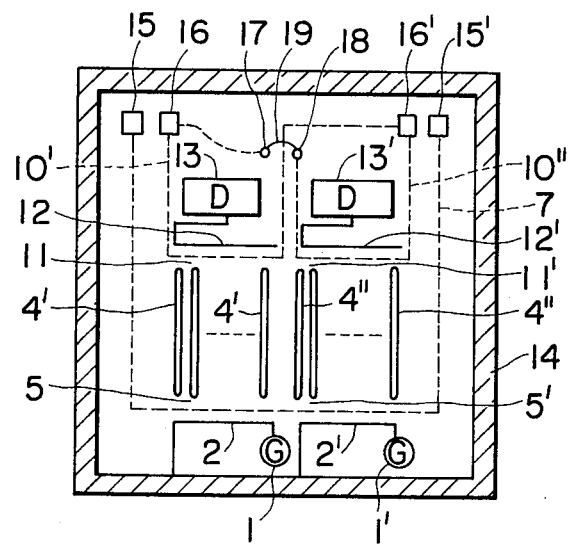
FIG. 3 is an arrangement plan of a magnetic bubble memory device according to this invention.

FIG. 3 is an arrangement plan of an embodiment of this invention. The operations of the whole construction are as in the prior art explained with reference to FIGS. 1 and 2. Here, only a portion according to this invention will be described in detail. In the embodiment of FIG. 3, the current pulse-supplying electrical conductor 7 for driving the write gates 5, 5' is situated between the write major lines 2, 2' and the minor loops 4'—4', 4"—4" and is connected via terminals 15, 15' to a driver circuit (not shown) serving as a write/transfer pulse source. The current pulse-supplying electrical conductor for driving the read gates 11, 11' is situated between the minor loops 4'—4', 4"—4" and the read major lines 12, 12'. As apparent from the figure, it is divided in two into electrical conductors 10' and 10". The electrical conductors 10' and 10" are connected in parallel. Therefore, both the ends of the electrical conductors 10' and 10" are connected to terminals 16, 16' which are to be connected to a current pulse supply source. Usually, these electrical conductors 7, 10' and 10" are disposed in a layer separate from a layer in which the generators 1, 1', the write and read major lines 2, 2', 12, 12', the write and read gates 5, 5', 11, 11', the minor loops 4'—4', 4"—4", the detectors 13, 13', the guardrail 14, etc. are disposed. Since, however, the electrical conductors 10' and 10" come to have an intersecting part as seen from the figure, only the part 19 at which the electrical conductor 10" intersects with the electrical conductor 10' is provided in another layer via lead-out terminals 17, 18. A driver circuit (not shown) serving as the replicate/transfer pulse source is externally connected to the terminals 16, 16'. In this way, the resistances of the electrical conductors 10', 10" through which replicate current pulses having a comparatively great amplitude and width are caused to flow can be reduced by half. Furthermore, since parallel connections within an identical chip exhibit very small deviations in resistance, it is unnecessary to insert any special adjusting resistor. More specifically, when parallel connections are made between chips, resistances deviate approximately ±30%. It is therefore necessary to insert an adjusting resistor so as to suppress the deviations of currents between the two parallel gates 11 and 11'. In this invention, however, the two gates are located within the identical chip and in close proximity, so that such deviations are not involved. It is really possible that the resistances of the two electrical conductors 10' and 10" will become discrepant depending upon the resistance of the intersecting portion 17→19→18 as shown in the figure or the path length of the conductor up to the terminal 16. Since, however, the discrepancy is constant, the resistance can be readily adjusted by such expedient as narrowing a part of the conductor.

The above description has been made of the example in which the current pulse-supplying electrical conductor for driving the read gates 11, 11' is divided into the two parts 10', 10". However, this need not be adhered to. If necessary, the invention may well be applied to the current-supplying electrical conductor 7 for driving the write gates 5, 5'.

The embodiment has been described as to the case where the number of division of the electrical conductor is two. However, any desired number of division greater than two may well be selected as is needed.

Figure 1:
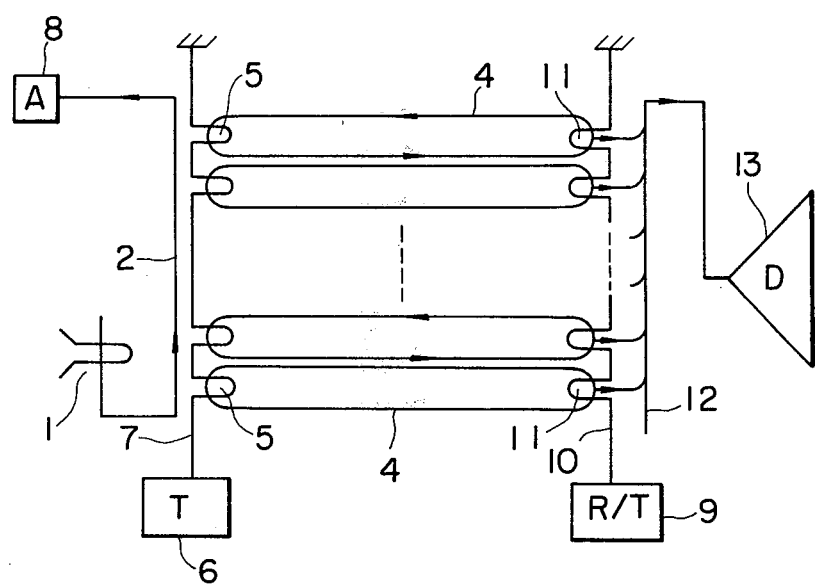
FIGS. 1 and 2 are arrangement plans of prior-art magnetic bubble memory devices.

Further, although the example in which the invention is applied to the construction of the magnetic bubble memory device illustrated in FIG. 2 has been described with reference to FIG. 3, it is a matter of course that the invention is applicable to any other construction of the magnetic bubble memory device, for example, the construction shown in FIG. 1.

As set forth above, the magnetic bubble memory device which has the electrical conductor divided into the plurality of parts according to this invention, the divided parts being connected in parallel with each other, can suppress the resistance of the electrical conductor into a sufficiently small value even when the memory capacity per unit area is increased. It can accordingly be driven by an inexpensive driver circuit having hitherto been used. The invention consequently contributes to the reduction of the cost of the entire device, and is very advantageous in industry.

I claim:

1. A magnetic bubble memory device comprising a layer of a material in which magnetic bubbles representative of information can be moved in response to a rotating magnetic field, a plurality of minor loops which serve to circulate the magnetic bubbles in said layer, a major line which is located in proximity to, and spaced from, one end of said each minor loop in order to read out the information from said minor loops, gates which are disposed between the respective minor loops and said major line and which have at least a replicating function, an electrical conductor which supplies a current pulse for driving said gates, and current pulse generator means for generating the current pulse,
    said electrical conductor being divided into a plurality of parts, the divided parts being connected to said current pulse generator means in a mutually parallel relationship, in order to apply simultaneously the current pulse generated by said current pulse generator means.

2. A magnetic bubble memory device according to claim 1, wherein said electrical conductor is divided in two.

3. A magnetic bubble memory device according to claim 1, wherein said gates have replicating and transferring functions.

4. A magnetic bubble memory device according to claim 1, wherein said current pulse generator means is a single pulse generator for simultaneously applying a pulse to said divided parts.

5. A magnetic bubble memory device comprising a layer of a material in which magnetic bubbles representative of an information can be moved in response to a rotating magnetic field, first and second minor-loop groups each of which consists of a plurality of minor loops and which serve to circulate the magnetic bubbles in said layer, first and second major lines which are respectively located in proximity to, and spaced from, said first and second minor-loop groups in order to read out the information therefrom, first and second gates which are respectively disposed between said first minor-loop group and said first major line and between said second minor-loop group and said second major line and each of which has at least a replicating function, first and second electrical conductors which supply current pulses for driving said first and second gates, respectively, current pulse generator means for generating the current pulses, and connection means for connecting to said current pulse generator means said first and second electrical conductors in parallel with each other.

6. A magnetic bubble memory device according to claim 5, wherein each of said first and second gates has replicating and transferring functions.

7. A magnetic bubble memory device comprising a layer of a material in which magnetic bubbles representative of information can be moved in response to a rotating magnetic field, a plurality of minor loops which serve to circulate the magnetic bubbles in said layer, a major line which is located in proximity to, and spaced from, one end of said each minor loop in order to read out the information from said minor loops, gates which are disposed between the respective minor loops and said major line and which have at least a replicating function, current pulse generator means for generating a current pulse on a pair of output terminals, and plural conductors connected to said output terminals in parallel to apply simultaneously the current pulse generated by said current pulse generator to drive said gates.

* * * * *